United States Patent
Chen

Patent Number: 6,057,249
Date of Patent: May 2, 2000

[54] METHOD FOR IMPROVING OPTICAL PROXIMITY EFFECT IN STORAGE NODE PATTERN

[75] Inventor: Guey-Son Chen, Taichung, Taiwan

[73] Assignee: Vanguard International Semiconductor Corp., Hsinchu, Taiwan

[21] Appl. No.: 09/063,994

[22] Filed: Apr. 21, 1998

[51] Int. Cl.[7] .......................... H01L 21/31; H01L 21/469
[52] U.S. Cl. ............................. 438/758; 438/800; 438/16
[58] Field of Search ...................................... 438/758, 800, 438/763, 14, 16, 18; 356/355, 357, 384

[56] References Cited

U.S. PATENT DOCUMENTS

| | | | |
|---|---|---|---|
| 4,200,396 | 4/1980 | Kleinknecht et al. | 356/384 |
| 4,330,213 | 5/1982 | Kleinknecht et al. | 356/355 |
| 4,964,726 | 10/1990 | Kleinknecht et al. | 356/357 |

*Primary Examiner*—Charles Bowers
*Assistant Examiner*—Craig Thompson
*Attorney, Agent, or Firm*—Christensen O'Connor Johnson & Kindness pllc

[57] ABSTRACT

A semiconductor mask has storage node patterns (101a, 101b, 101c, 101d) defining a first region and a second region. Serifs (10) are provided adjacent corners of the storage node patterns for reducing optical proximity effects. Diffraction bars (202) are positioned between the patterns in the first region. In alternative embodiments of the invention, a diffraction bar (702, 802) is situated adjacent patterns that are variously arranged and configured with respect to the diffraction bar.

5 Claims, 6 Drawing Sheets

METHOD FOR IMPROVING OPTICAL PROXIMITY EFFECT IN STORAGE NODE PATTERN

FIELD OF THE INVENTION

The present invention relates to a method of forming storage node patterns in semiconductor fabrication and, more specifically, to a method of improving optical proximity effects and reducing critical dimension variation during the formation of storage node patterns.

BACKGROUND OF THE INVENTION

The trend in semiconductor fabrication technologies is to minimize the size of semi-conductor devices. Photolithography is a critical step in semiconductor fabrication to control the size of semiconductor devices. However, during the photolithography process, the formation of node patterns for semiconductor devices is often nonuniform due to a well-known phenomenon commonly referred to as the optical proximity effect. The optical proximity effect causes nonuniformity in critical dimensions.

As shown in FIG. 1, to address optical proximity effects and increase areas exposed during lithography, a plurality of serifs 10 are arranged at corners of node patterns 101a, b, c, d. The provision of serifs 10, to some extent, can reduce the distortion caused by the node patterns 101a, b, c, d. However, it will be appreciated that the light intensity caused by exposure is very large in a region designated. Such exposure strongly causes nearby distortion. In addition, such exposure also causes top loss of photoresist during defocus, and reduces the process latitude due to node patterns asymmetries and nonuniform exposure intensities applied to photoresist layers.

SUMMARY OF THE INVENTION

A method and apparatus relating to a mask layout is provided. With respect to one aspect of the invention, the mask layout includes a plurality of diffraction bars adjacent node patterns. The diffraction bars are rectangular and arranged in parallel. The diffraction bars are situated in a first region defined by the patterns. Serifs are provided adjacent corners of the patterns.

In accordance with further aspects of the invention, a diffraction bar having a square shape is provided. The diffraction bar is situated between a plurality of patterns having a rectangular shape.

In accordance with still further aspects of the present invention, the diffraction bar is square. Patterns, in the form of square rings, surround the diffraction bar.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings; wherein.

DETAILED DESCRIPTION OF THE PREFERRED EMBODIMENT

Figure 2:
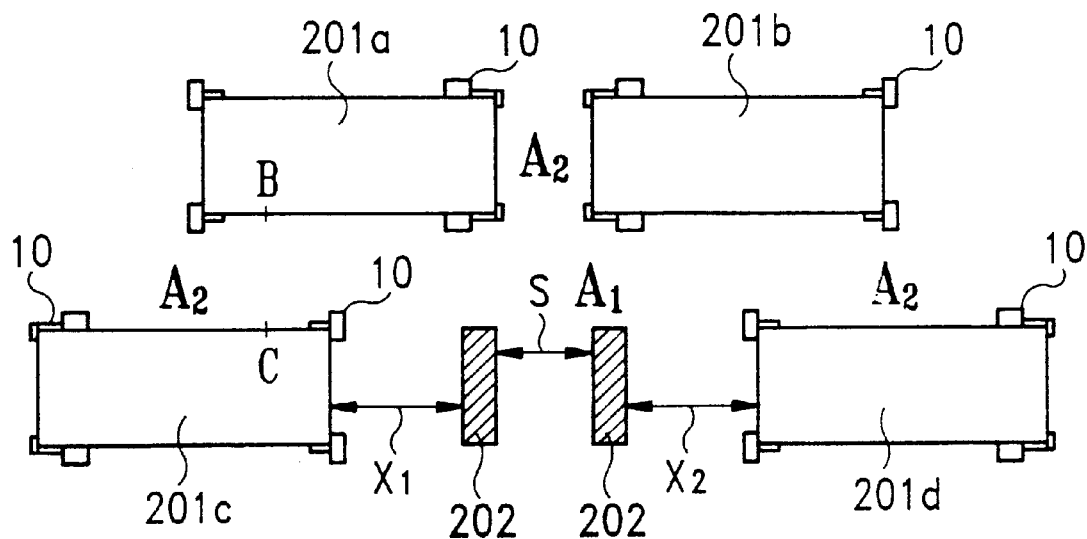
FIG. 2 is an illustration of a mask layout having diffraction bars adjacent storage node patterns in accordance with the present invention.

The present invention relates to a method and apparatus for forming storage node patterns. Diffraction bars are added to reduce and, in some instances, eliminate the distortion in such patterns caused by relatively high exposure intensities in empty areas. FIG. 2 illustrates a plurality of storage node patterns 201a, 201b, 201c, 201d arranged in a mask. Serifs 10 are provided adjacent the corners of the storage node patterns 201a, 201b, 201c, 201d. Two regions are formed between the storage node patterns 201a, 201b, 201c, 201d. A first region, designated region $A_1$, is wider than a second region, designated region $A_2$. Two diffraction bars 202 are positioned in region $A_1$. The following dimensions describe the orientation and size of the diffraction bars 202 as they relate to the storage node patterns 201a, 201b, 201c, 201d. A spacing S, which defines the distance between the diffraction bars 202, is approximately 0.4 μm. Distance $X_1$, which defines the distance between the storage node pattern 201c and the adjacent diffraction bar 202, and distance $X_2$, which defines the distance between the storage node pattern 201d and the adjacent diffraction bar 202, are both approximately 0.5 μm. The width of each of the diffraction bars 202 is approximately 0.2 μm. Of course, other suitable dimensions and orientations for the diffraction bars 202 with respect to the storage node patterns 201c, 201d are also possible.

Figure 1:
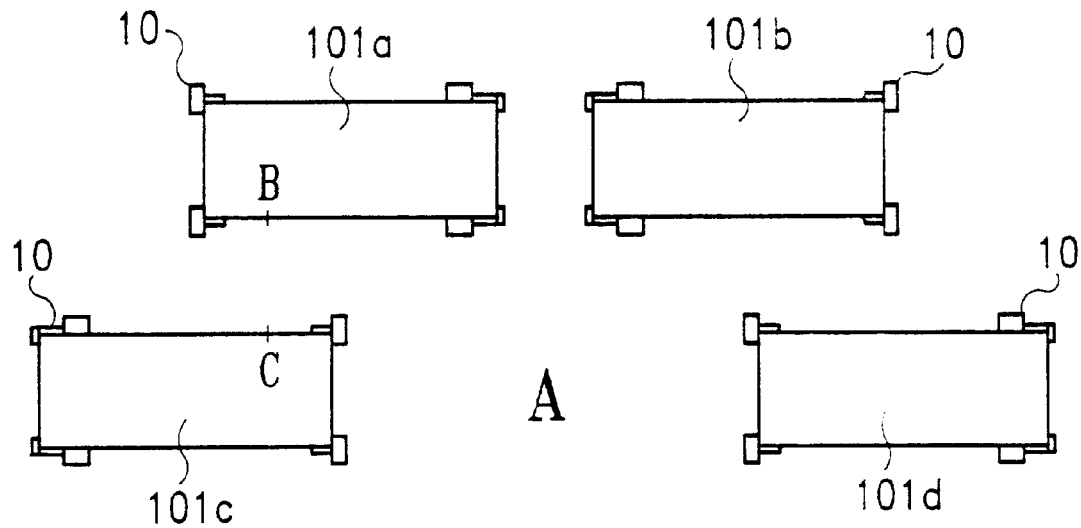
FIG. 1 is an illustration of a mask layout of storage node patterns according to the prior art.
Figure 3:
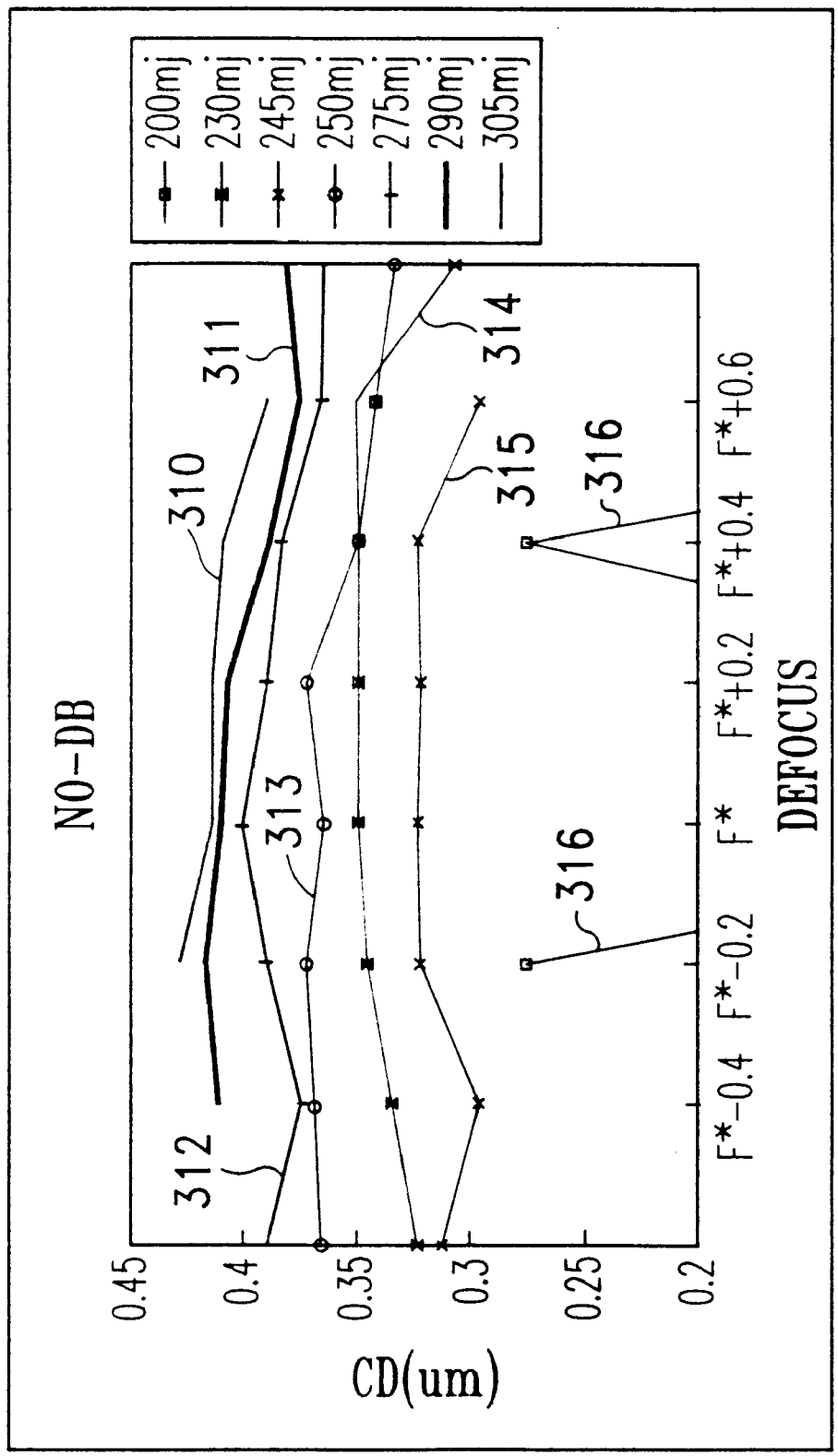
FIG. 3 is a graph illustrating the defocus dependence of a critical dimension for a Focus-Exposure Matrix in accordance with the prior art.
Figure 4:
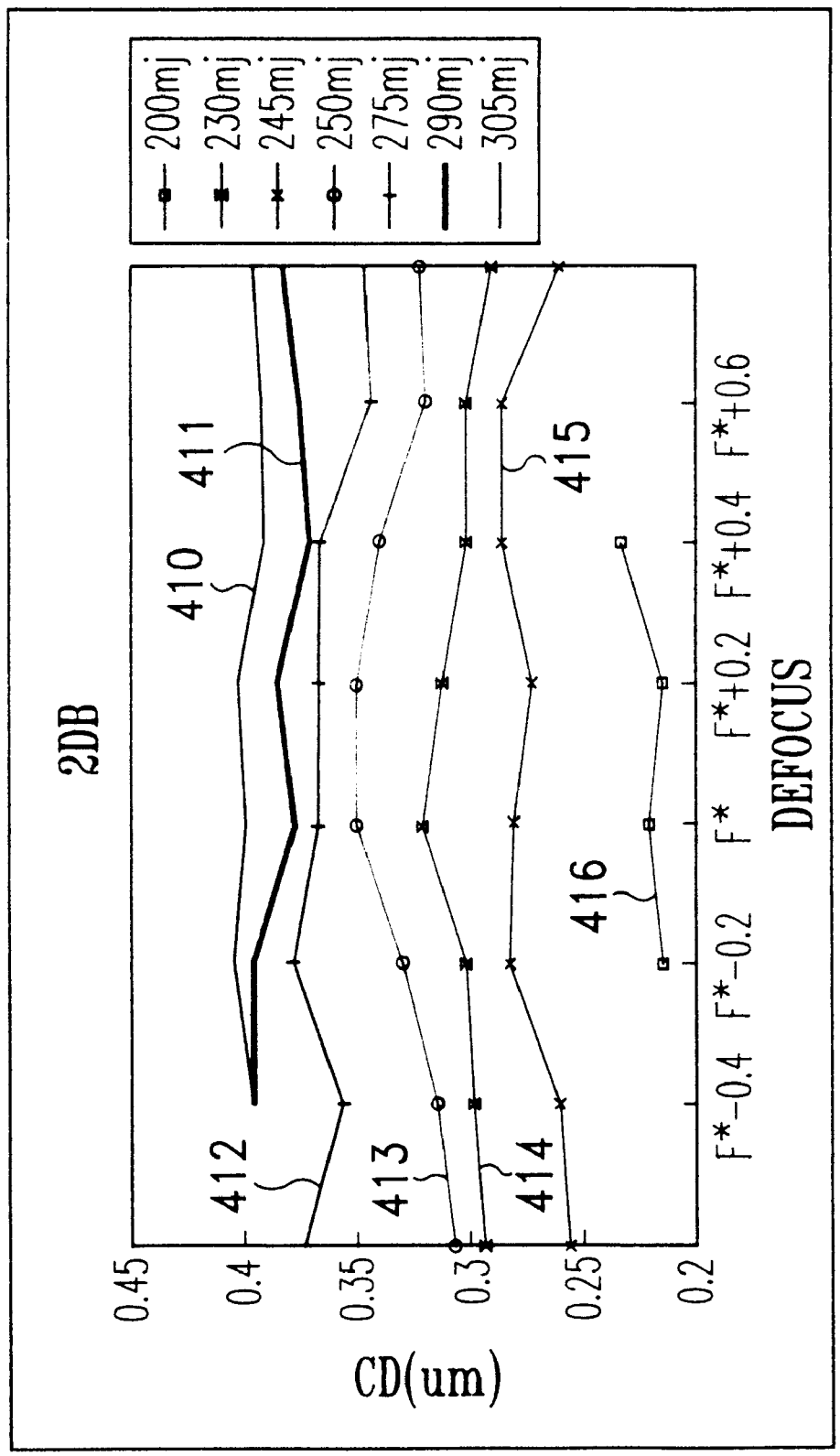
FIG. 4 is a graph illustrating the defocus dependence of a critical dimension for a Focus-Exposure Matrix in accordance with the present invention.

FIGS. 3 and 4 illustrate a focus-exposure matrix (FEM) for the storage node patterns at points B and C in FIGS. 1 and 2, respectively. FIG. 3 shows the defocus dependence of a critical dimension (CD) in connection with an FEM when no diffraction bars are used. Curves 310, 311, 312, 313, 314, 315, 316 are various CD data curves representing data measured from different defocus positions, and based upon I-line sources having various exposure energies. More specifically, curve 310 results from an exposure energy of 305 millijoules (mj); curve 311 results from an exposure energy of 290 mj; curve 312 results from an exposure energy of 275 mj; curve 313 results from an exposure energy of 250 mj; curve 314 results from an exposure energy of 230 mj; curve 315 results from an exposure energy of 245 mj; and, curve 316 results from an exposure energy of 200 mj. As indicated by curve 316, the node patterns are bridged at the focus position of original focus and the focus position of F*+0.2 μm where F* represents the original focus position. The resolution is approximately 0.27 μm.

FIG. 4 shows the defocus dependence of a critical dimension (CD) in connection with an FEM when diffraction bars are used in accordance with the present invention. Curves 410, 411, 412, 413, 414, 415, 416 are various CD data curves representing data measured from different defocus positions, and based upon I-line sources having various exposure energies. More specifically, curve 410 results from an exposure energy of 305 millijoules (mj); curve 411 results from an exposure energy of 290 mj; curve 412 results from an exposure energy of 275 mj; curve 413 results from an exposure energy of 250 mj; curve 414 results from an exposure energy of 230 mj; curve 415 results from an exposure energy of 245 mj; and, curve 416 results from an exposure energy of 200 mj. As indicated by curve 416, the resolution is approximately 0.22 μm. Such resolution represents a significant improvement over prior art capabilities, better satisfying the requirements of I-line photographic applications and related constraints. It will also be appreciated by those skilled in this art and others that, by comparison of FIG. 3 with FIG. 4, the use of diffraction bars in accordance with the present invention provides wider process latitude.

Figure 5A:
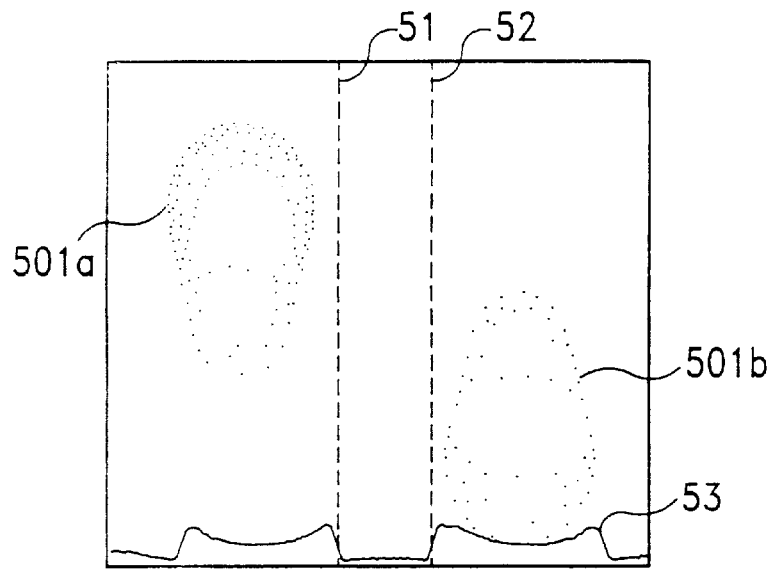
FIG. 5A is an illustration of focus meander patterns at a focus position of F*+0.6 μm when diffraction bars are not used in accordance with the prior art.

FIG. 5A illustrates focus meander patterns 501a, 501b when diffractions bars are not used. The focus meander patterns 501a, 501b are produced from a focus position of F*+0.6 μm, where F* represents the original focus position. Longitudinal lines 51, 52 represent the spacing between the focus meander patterns 501a, 501b. Curve 53 represents the profile of the focus meander patterns 501a, 501b.

Figure 5B:
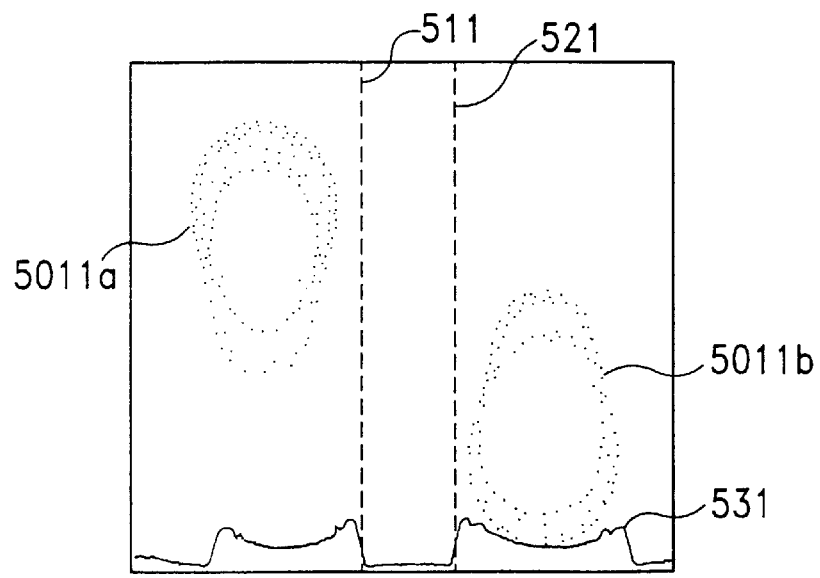
FIG. 5B is an illustration of focus meander patterns at a focus position of F*+0.6 μm when diffraction bars are used in accordance with the present invention.

FIG. 5B illustrates focus meander patterns 5011a, 5011b when diffraction bars are used in connection with the present invention. The focus meander patterns 5011a, 5011b are produced from a focus position of F*+0.6 μm where F* represents the original focus position. Longitudinal lines 511, 521 represent the spacing between the focus meander patterns 5011a, 5011b. Curve 531 represents the profile of the focus meander patterns 5011a, 5011b. A comparison of FIG. 5A with FIG. 5B illustrates the advantage of minimal photoresist top loss when diffraction bars are used in accordance with the present invention.

Figure 6A:
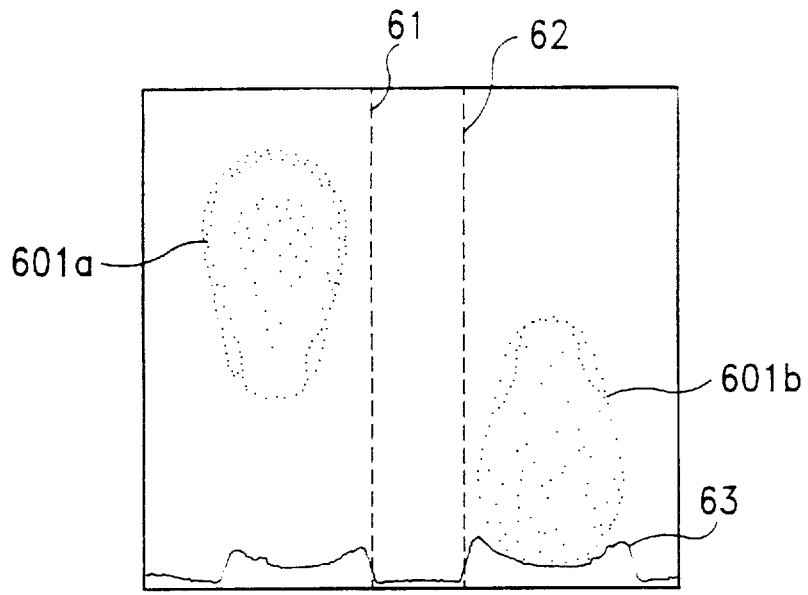
FIG. 6A is an illustration of focus meander patterns at a focus position of F−0.6 μm when diffraction bars are not used in accordance with the prior art.

Further, when the focus position is lowered, the use of diffraction bars minimizes deformation, as compared to the deformation produced when no diffraction bars are used. FIG. 6A illustrates focus meander patterns 601a, 601b when diffraction bars are not used. The focus meander patterns 601a, 601b are produced from a focus position of F−0.6 μm, where F* represents the original focus position. Longitudinal lines 61, 62 represent the spacing between the focus meander patterns 601a, 601b. Curve 63 represents the profile of the focus meander patterns 601a, 601b.

Figure 6B:
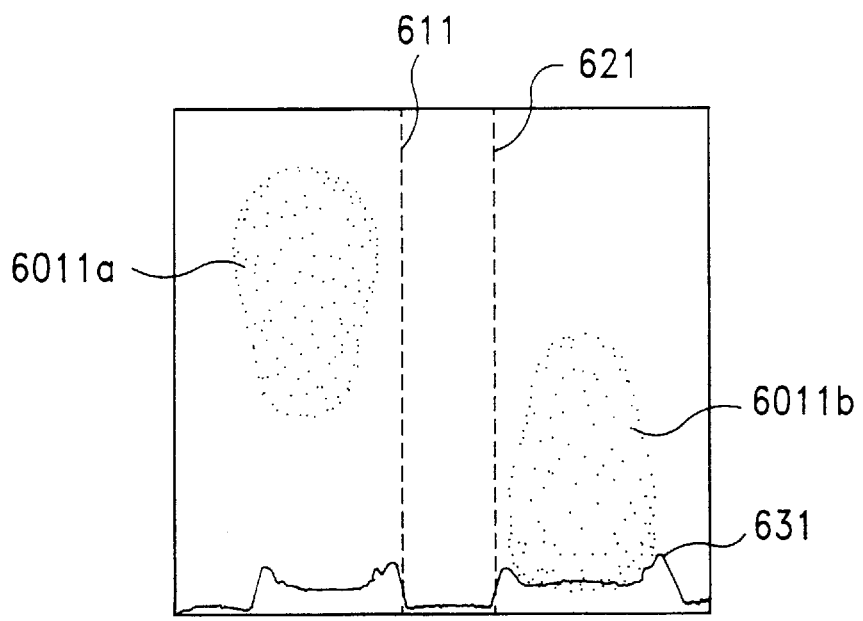
FIG. 6B is an illustration of focus meander patterns at a focus position of F−0.6 μm when diffraction bars are used in accordance with the present invention.

FIG. 6B illustrates focus meander patterns 6011a, 6011b when diffraction bars are used in accordance with the present invention. The focus meander patterns 6011a, 6011b are produced from a focus position of F−0.6 μm, where F* represents the original focus position. Longitudinal lines 611, 621 represent the spacing between the focus meander patterns 6011a, 6011b. Curve 631 represents the profile of the focus meander patterns 6011a, 6011b. It will be appreciated that deformation is significantly reduced by the use of diffraction bars.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

Figure 7:
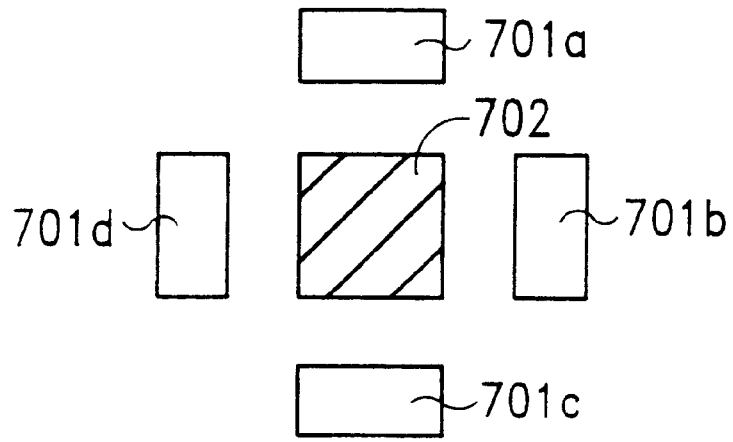
FIG. 7 is a first alternative embodiment of a mask layout having a diffraction bar adjacent storage node patterns in accordance with the present invention.
Figure 8:
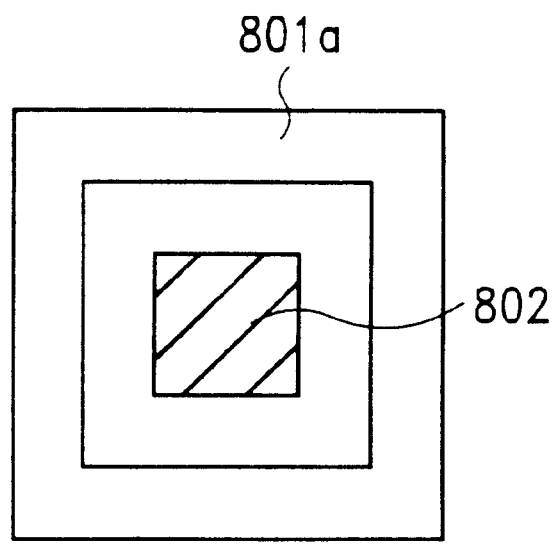
FIG. 8 is a second alternative embodiment of a mask layout having a diffraction bar adjacent storage node patterns in accordance with the present invention.

While the preferred embodiment of the invention has been illustrated and described, it will be appreciated that various changes can be made therein without departing from the spirit and scope of the invention. For example, the present invention can be modified by changing the arrangement and number of diffraction bars. FIG. 7, for example, illustrates a diffraction bar 702 situated centrally among spaced-apart storage node patterns 701a, 701b, 701c, 701d. The diffraction bar 702 is substantially square. The storage node patterns 701a, 701b, 701c, 701d are rectangular. As another example, FIG. 8 illustrates a diffraction bar 802 that is situated within storage node patterns 801a, 801b. The storage node pattern 801a surrounds the storage node pattern 801b, which surrounds the diffraction bar 802. The storage node patterns 801a, 801b are shaped in the form of rectangular rings.

While the preferred embodiment of the invention has been illustrated and described, it will be appreciated that various changes can be made therein without departing from the spirit and scope of the invention.

What is claimed is:

1. A method of using a semiconductor fabrication mask having patterns comprising:

forming first subpatterns adjacent edges of the patterns; and providing at least one diffraction bar adjacent the patterns.

2. The method of claim 1 further comprising:

configuring the at least one diffraction bar as a square;

configuring the patterns to be rectangular; and providing that the at least one diffraction bar is larger than each of the patterns.

3. The method of claim 2 further comprising placing serifs adjacent corners of the patterns.

4. The method of claim 1 further comprising:

configuring the at least one diffraction bar as a square;

configuring the patterns as square rings; and surrounding the at least one diffraction bar with the patterns.

5. The method of claim 4 further comprising placing serifs adjacent corners of the patterns.

* * * * *

UNITED STATES PATENT AND TRADEMARK OFFICE
CERTIFICATE OF CORRECTION

PATENT NO. : 6,057,249
DATED : May 2, 2000
INVENTOR(S) : G.-S. Chen

It is certified that error appears in the above-identified patent and that said Letters Patent is hereby corrected as shown below:

| COLUMN | LINE | |
|---|---|---|
| [57] Pg. 1, col. 2 | Abstract 3 | "comers" should be --corners-- |
| 4 (Claim 3, | 46 line 2) | "comers" should be --corners-- |
| 4 (Claim 5, | 53 line 2) | "comers" should be --corners-- |

Signed and Sealed this

Seventeenth Day of April, 2001

Attest:

Attesting Officer

NICHOLAS P. GODICI

Acting Director of the United States Patent and Trademark Office